United States Patent [19]

Yasui et al.

[11] Patent Number: 4,676,195

[45] Date of Patent: Jun. 30, 1987

[54] APPARATUS FOR PERFORMING PLASMA CHEMICAL VAPOR DEPOSITION

[75] Inventors: Masaru Yasui, Yokohama; Kazuaki Hokoda, Kawasaki; Makoto Yoshida, Shinagawa, all of Japan

[73] Assignee: Stanley Electric Co., Ltd., Tokyo, Japan

[21] Appl. No.: 651,063

[22] Filed: Sep. 13, 1984

[51] Int. Cl.⁴ ............................................. C23C 16/48
[52] U.S. Cl. ..................... 118/723; 118/729; 118/730; 118/50.1; 427/39
[58] Field of Search ................... 427/39; 118/730, 723, 118/50.1, 729; 430/128

[56] References Cited

U.S. PATENT DOCUMENTS 3,069,286 12/1962 Hall .................. 118/723 X
3,915,119 10/1975 Roy ...................... 118/723
3,996,884 12/1976 Horiguchi ............ 118/723
4,262,631 4/1981 Kubacki ............... 427/39 X
4,418,645 12/1983 Knights ............... 118/723 X
4,450,787 5/1984 Weakliem et al. ........ 118/723
4,466,380 8/1984 Jansen et al. .......... 427/39 X
4,501,766 2/1985 Suzuki et al. ........ 118/730 X
4,543,267 9/1985 Yamazaki ................ 427/39

Primary Examiner—Richard Bueker
Attorney, Agent, or Firm—Spensley Horn Jubas & Lubitz

[57] ABSTRACT

In a capacitance coupled type plasma CVD apparatus for depositing a thin film of reaction product of gas on a substrate by glow discharge at an elevated film-forming rate without lowering the function and ability of the formed film and to ensure the CVD operation to be carried out continuously or repetitively for an extended period of time, the electrode facing the substrate is provided as a net of a metal. The substrate is a cylindrical electrode, and the net-like electrode may be formed as a cylindrical net surrounding this cylindrical substrate, or as a pair of opposing flat sheets of net movably sandwiching rotating and movable plural cylindrical substrates therebetween.

19 Claims, 4 Drawing Figures

APPARATUS FOR PERFORMING PLASMA CHEMICAL VAPOR DEPOSITION

BACKGROUND OF THE INVENTION (a) Field of the Invention:

The present invention relates to an apparatus for performing plasma chemical vapor deposition, and more particularly it relates to the electrode structure for use in plasma vapor deposition apparatuses of the capacitance coupled type.

(b) Description of the Prior Art:

The so-called plasma chemical vapor deposition technique which will hereinafter be called simply "plasma CVD" technique comprises: introducing a gaseous reaction material for chemical reaction into an appropriate closed but evacuatable chamber and developing a glow discharge in said chamber to cause reaction between the enclosed material to deposit the reaction product on the smooth surface of a substrate housed in said chamber. This technique is indispensable at the present stage of art as a widely utilized process in the manufacture of semiconductor devices and various other electric as well as electronic parts such as the formation of thin insulating films of $SiO_2$ or $Si_3N_4$, or thin semiconductor layers of, for example, amorphous silicon (a-Si). The apparatuses employed for performing such CVD process are, basically, divided roughly into the induction coupled type and the capacitance coupled type. The former is operated in such a way that the glow discharge is induced by a radio frequency coil (RF coil) which is wound around the reaction chamber. The latter is performed so that the glow discharge is induced by a radio frequency power applied across the electrodes provided within the chamber. FIG. 1 shows the basic arrangement of a conventional example of the CVD apparatus of the induction coupled type. In FIG. 1, reference numeral 1 represents a closed type reaction chamber; 2 an RF coil wound around the reaction chamber 1; 3 a tank for storing a gaseous reaction material such as silane ($SiH_4$) gas requiring a reaction; 4 a conduit pipe for introducing, into the reaction chamber 1, the gaseous reaction material contained in the storage tank 3; 5 a drum-like substrate rotatably supported within the reaction chamber 1; symbol M a motor for rotating the drum-like substrate; symbol RF a radio frequency power supply connected to the RF coil 2; and symbol RP an evacuation pump. This conventional CVD apparatus is utilitzed in such a way that a glow discharge is caused while introducing gaseous reaction material such as $SiH_4$ gas into the reaction vessel 1 via the conduit pipe 4, and concurrently therewith the drum-like substrate 5 is rotated by the motor M, whereby an a-Si film is deposited as a thin layer of the surface of the drum-like substrate 5. In this conventional apparatus, the structure per se of the reaction chamber 1 is relatively simple. However, this known apparatus has the disadvantages in that it is difficult to make uniformal the thickness of the film formed, by deposition, on the surface of the substrate 5 and that there is a difficulty in controlling the film-forming rate. Description has been made above with respect to the instance wherein a film serving as photo-receptor is manufactured. It should be noted that various problems are entailed also in the manufacture of other types of devices.

In contrast thereto, the CVD apparatus of the capacitance coupled type has recently been tended to be adopted, in place of the induction coupled type CVD apparatus, as being an apparatus capable of eliminating the above-mentioned inconveniences and drawbacks of the induction coupled type CVD apparatus.

FIG. 2 shows a basic arrangement of a conventional example of the capacitance coupled type CVD apparatus. In FIG. 2, like reference numerals and symbols are assigned to those component parts which are practically the same as those in FIG. 1. That is, reference numeral 6 represents a hollow tubular RF electrode having a number of gas-ejecting perforations 7 surrounding the drum-like substrate which concurrently serves as an electrode; and 8 a shielding plate covering the entire external circumstance of the hollow tubular electrode 7 to insure that the glow discharge is restricted between the drum-like electrode 5 and its opposing electrode 7. This conventional apparatus having the above-mentioned arrangement is operated in such a way that, while introducing, for example, $SiH_4$ gas into the reaction vessel 1 via the conduit pipe 4, a glow discharge is induced across the electrodes 5 and 7, to thereby cause deposition of an a-Si film onto the surface of the drum-like electrode 5. With a capacitance coupled type CVD apparatus of the prior art having such an arrangement as mentioned above, it is possible to make uniformal the thickness of the entire film which is produced by deposition, and also it is easy to control the film-forming rate. In order to produce a film having a good function and ability with a high productivity, however, this conventional apparatus still possesses various problems to be solved.

These drawbacks and inconveniences encountered in the conventional CVD apparatuses will hereunder be described with respect to the instance wherein the a-Si film thus produced is utilized as a photo-receptor.

In order to improve the function and ability of the a-Si film in general, it is necessary to give considerations to such points as mentioned below. They are: (a) reducing the flow rate and the mol ratio of the gas which is introduced into the chamber to relatively lower the film-forming rate; (b) using RF power of as small a density as possible; (c) using a low-pressure gas of a level lower than 1 Torr during the glow discharge; and (d) set the substrate at an appropriate temperature. This means that the factors such as the flow rate of $SiH_4$ gas, the RF power value and the distance between the electrodes are to be so selected as to provide adequate conditions.

In such devices as solar batteries and thin-film transistors using a-Si films, it should be noted that the a-Si films used therein may have a film thickness of about 1 micrometer or smaller, so that, even when importance is attached to the ability and function of the produced film, the formation of the film does not consume so much time when attention is given to the fact that the film-formation rate by the conventional plasma CVD apparatus is 1~2 μm/hour, and thus it will be appreciated that the film thickness does not greatly affect the productivity. However, in order to use an a-Si film to serve as a photo-receptor, the film requires usually a thickness ranging from 10 to 50 micrometers. Thus, the acquisition of a photo-receptor having a required thickness will take several to several ten hours according to this conventional apparatus, which is indeed impractical. Therefore, in order to form an a-Si film in a ralatively short period of time, i.e. in order to operate the manufacturing apparatus within a practical length of time by improving the film-forming rate, it will be necessary to increase the flow rate and the mol ratio of SiH$_4$ gas, and to elevate the RF power value as well as the pressure of gas which is applied, contrary to the instance performed by the conventional apparatus. However, as will be described later, such a contrary manner of operation as mentioned above has introduced various practical drawbacks in the conventional apparatuses such as lowering the quality of the film or the incapability of successive formation of films on a plurality of drums. Even with the apparatus having such an improved electrode structure as shown in FIG. 2 to form a good-quality film at a relatively high film formation speed, there still are present such problems as mentioned above. Thus, it has been impossible to obtain an a-Si film having a good function and ability and having a uniform required film thickness in one cycle of plasma CVD operation.

In the effort of improving the film-forming rate or in case the apparatus is used for an extended period of time in the conventional plasma CVD apparatuses, the first fatal reason for bringing about lowering of the function and ability of the a-Si film which is produced is as mentioned below. The decomposition of a reaction material such as SiH$_4$ caused by a glow discharge takes place in such a manner as follows. That is, decomposition of the material starts at the stage that a gas is introduced into the region in which a glow discharge is being developed. This decomposition is accelerated as the gas advances through this region, and radicals (herein, this term collectively means those activated Si atoms and neutral Si-H or SiH$_2$ which have been activated by decomposition) will progressively augment in their amount. As these radicals increase, they will come to collide with each other in the gaseous atmosphere and will coaggulate, growing into fine particles of a-Si and other substances. These respective particles will further coaggulate together into respective fine powders. An a-Si film, thus, is formed not only on the surface of the substrate alone, but also will be formed over all other areas of the glow discharge region. As a result, in the vicinity of the gas-ejection orifices 6 of the opposing electrode 7, deposits of a-Si and other substances will adhere, in a relatively tough state, onto the surface of this electrode. On the other hand, at sites of the electrode located remote from the ejection orifices, powdery substances will deposit. In the intermediate areas located therebetween, substances which are in a condition intermediate of the above-mentioned two types of conditions will deposit. Such phenomena take place, as a matter of fact, more intensively for a greater flow rate of gas and for a higher pressure of reaction which are employed, and for a broader region of glow discharge, encompassing a wide range of areas within the reaction chamber. This deposition phenomenon as mentioned above takes place most intensively on the surface of the opposing electrode. Accordingly, if the film-forming rate is increased or if the plasma CVD is carried out for an extended period of time, such deposition of unnecessary substances will augment accordingly. At the time the amount of this deposition becomes critically large, the deposits will begin to come off from, for example, the surface of the opposing electrode due to, for example, stress-strain caused by the difference in thermal expansion of the substances, and these freed particles will scatter in the form of the so-called fine flakes, and they will hit the surface of the drum and will damage the film itself which is formed thereon. Also, there would arise the phenomenon that very fine powder which scatters along with the above-mentioned fine flakes, or that those fine particles produced in the gaseous atmosphere will become mingled into the aimed a-Si film formed on the surface of the drum, and will lower the function and ability of this formed a-Si film.

In addition, it should be noted that conventional plasma CVD apparatuses are arranged so that the drum 5 which serves as the substrate is used concurrently as an electrode, and that there is provided a rigid metal electrode 6 made of, for example, stainless steel having a number of gas ejection orifices 7 and this electrode is arranged so as to surround the drum 5 to face it. Besides, a metal plate having a rigidity is usually provided around the external circumference of the metal electrode 6 to shield it. This shielding plate 8 is intended to prevent the glow discharge from expanding widely to other regions than the space across the two electrodes when the reaction gas is introduced at a low pressure level. The presence of this shielding plate 8, while restricting the glow discharge to occur relatively in the space between the two electrodes, will naturally tend to cause the glow discharge to be contained in a restricted spatial region. Thus, there tends to occur the stagnation of the introduced gas, and it has been impossible to avoid the development of the abovesaid flakes and the acceleration of their development.

As discussed above, in the conventional plasma CVD apparatuses mentioned, it has been difficult to substantially increase the film-forming rate. Even if this rate is ever increased, the development of flakes and fine powder of substances has contributed to the lowering of the ability and function of the film produced. Also, the conventional apparatuses have the further drawback that, owing to the development of flakes and fine powder, the plasma CVD could not be carried out continuously for an extended period of time.

SUMMARY OF THE INVENTION

It is, therefore, a primary object of the present invention to provide a capacitance coupled type plasma CVD apparatus which is capable of elevating the film forming rate without lowering the ability and function of the film produced, and which is able to carry out plasma CVD continuously or repetitively for an extended period of time.

Another object of the present invention is to provide a capacitance coupled type plasma CVD apparatus having a simplified electrode structure such that the configuration or type of the substrate which serves as an electrode is not limited.

According to the present invention, these objects are attained by forming, in the shape of a metal net, the other electrode facing the substrate electrode.

According to a preferred formation of the present invention, the electrode of a net shape is made of a stainless steel wire formed into a tubular configuration surrounding the substrate, or alternatively two flat sheets of metal net are disposed in parallel with each other sandwiching the tubular substrate therebetween. It should be noted that between a pair of flat net-like metal electrode sheets can be disposed a row of a plurality of tubular substrates. Furthermore, the plurality of tubular substrates may be arranged to be movable so as to be removed one after another to the outside of the apparatus.

According to another preferred formation of the present invention, the net-shape electrode is composed of an electro-conductive metal wire having a diameter of 0.05~2 mm, and that the distance between any opposing adjacent runs of wire constituting the meshes of this net is 0.2~5 mm.

According to still another preferred formation of the present invention, the gas introduction section for introducing a reaction gas into the reaction chamber is positioned on the same plane as that of the net-like electrode on side of the net-like electrode away from the substrate, or at a distance from the net-like electrode.

By using a net-like electrode which faces the tubular substrate as in the present invention, decomposition caused by the glow discharge is not restricted to a confined space as in the conventional apparatuses. Accordingly, there will not arise the stagnation of the reaction gas and of the reacted gas. Therefore, an excessive rate of decomposition can be avoided. As a result, radicals will become discharged to the outside of the reaction section prior to their becoming powderized. Also, even in case they become powderized, the powder thus developed will not easily deposit on the inner surface of the reaction zone.

Also, those products which have been formed into a layer as aresult of deposition on the net-like electrode may increase their stress-strain due to the difference in thermal expansion which arises as this layer gains its thickness progressively. However, because the electrode is a net which is made with fine metal wire, the stress strain will become scatterd. Thus, the stress-strain will assume only a small value, and its rate of increase will be insignificantly low. As such, in case the electrode has a large area and has a high rigidity as in the conventional electrode, following off of the adhering substances from the electrode in the form of fine flakes has tended to occur easily. However, with the electrode formed according to the present invention, flakes will rarely fall off.

By using the net-like electrode according to the present invention, it should be noted that, even when the flow rate of the reaction gas, the RF power value as well as the gas pressure are elevated substantially, it is still possible to prevent the generation and deposition of fine powder in the reaction zone. It is also possible to avoid the formation of powder and fine flakes which come off from the surface of the electrode and scatter around in the reaction zone. Thus, it becomes possible to continue the film forming operation for an extended period of time at a high production rate.

In the past, there has been considered an arrangement that the electrode facing the substrate is split so as to discharge the reacted waste gas through the gap between the split pieces of electrode. Such an arrangement, however, has brought about non-uniformity of glow discharge, and also it has tended to generate abnormal glow discharge at the gap area. Since the diameter of the metal wire which constitutes the net of the net-like electrode of the present invention is small, and, on the other hand, because the meshes of this net are considerably large in size, and also because the meshes are distributed uniformly throughout the entire sheet of electrode, there arises no derangement of glow discharge. Moreover, in the conventional apparatuses, the pressure of the reaction gas which is introduced has required to be set at a relatively low value. Thus, the glow discharge has taken place in an expanded region in the chamber, and accordingly the provision of the above-said shielding plate has been necessary. The present invention, however, allows the use of an elevated gas pressure, and therefore it is possible to stably localize the glow discharge zone in the space located between the facing electrodes without the aid of such a shielding plate.

Also, the structure of the electrode used in the conventional apparatus, especially the electrode structure having a shielding plate provided around this electrode is considerably complicated, and accordingly it has not been easy to detach and attach the electrode to and from the apparatus. In case the electrode is of a metal net form as in the present invention, however, the detachment and attachment of the electrode are performed in an easy and simple manner. Moreover, because the net-form electrode is light in weight, it can be replaced quite easily. In addition, because the net-like electrode is cheap in price, it will be noted that, if the electrode is replaced at each time of CVD operation, it is possible to use an electrode which is always free of deposits sticking thereto, and that, accordingly, films of good quality can be obtained.

Furthermore, in case of an electrode of net form, it is possible to fabricate an electrode very simply and readily irrespective of its configuration and size, and accordingly its utility is greatly enhanced. Also, because one can design the distance between the facing electrodes appropriately, there is a further advantage that the condition of glow discharge can be easily controlled.

These and other objects of the present invention will become more apparent during the course of the following detailed description and appended claims.

DETAILED DESCRIPTION OF THE PREFERRED EMBODIMENTS

The present invention will hereunder be described in further detail with respect to an instance of manufacturing a drum-like a-Si photo-receptor.

Figure 1:
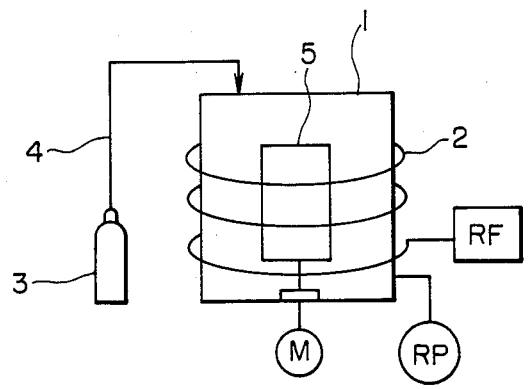
FIG. 1 is a diagrammatic illustration, showing the basic construction of a conventional induction coupled type plasma CVD apparatus suitable for use in manufacturing a drum-like a-Si photo-receptor.
Figure 2:
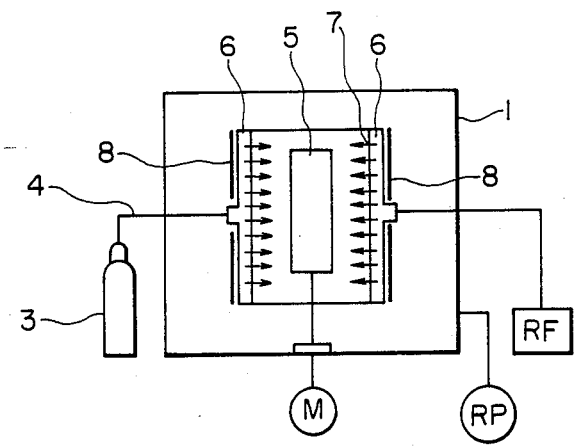
FIG. 2 is a diagrammatic illustration, showing the basic construction of a conventional capacitance coupled type plasma CVD apparatus suitable for use in manufacturing a drum-like a-Si photo-receptor.
Figure 3:
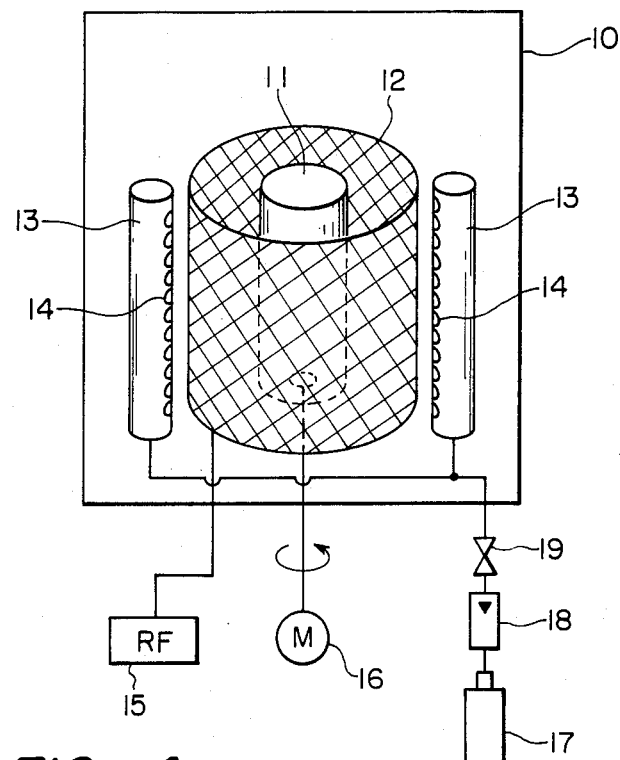
FIG. 3 is a diagrammatic illustration, showing the outline of an embodiment of the capacitance coupled type plasma CVD apparatus accoridng to the present invention.

By giving reference first to FIG. 3, there is provided, within a closed but evacuatable reaction chamber 10, an electro-conductive drum 11 which will serve as a substrate and also as one of the pair of electrodes, which is caused to rotate from an external motor 16. Furthermore, in this reaction chamber 10, there is disposed an electrode 12 which is constructed with a metal sheet of net concentrically surrounding the drum 11. In the embodiment of FIG. 3, this electrode 12 is constructed with a cylindrical sheet of net surrounding the drum 11. And, using this cylindrical metal net-like sheet 12 and the drum 11 as a pair of electrodes, a capacitance coupled type power is supplied across these electrodes from an RF power supply 15. A reaction gas is supplied into the reaction chamber 10 under pressure from a gas container 17 disposed externally of the reaction chamber 10 while being adjusted of its flow rate and concentration by a flow rate adjusting valve 19. Gas introducing tubes 13 which are disposed within the reaction chamber 10 each has a plurality of gas ejection orifices 14 facing the drum 11. The gas introducing tubes 13 may be disposed so that their gas ejection orifices 14 may be positioned in the same plane as that of the net-like electrode 12 surrounding the drum 11, or the gas introducing tubes 13 may be disposed so that their gas ejection orifices 14 are positioned on the outside of the net-like electrode 12 remote from the drum 11. The gas introducing tube 13 may be provided either in a singular number or in a plural number, at a position contacting the net-like electrode 12 or at an appropriate position on that side of the net-like electrode 12 away from the drum-shaped substrate electrode 11.

This net-like electrode 12 desirably is made of a metal which will hardly absorb the waste gas as the latter is being exhausted from the reaction chamber 10, and to this end. A metal such as stainless steel is most suitable. Also, the configuration of meshes of the net may be square, rectangular or honeycomb in shape. However, the diameter of the wire which constitutes the meshes is in the range of 0.05~2 mm, preferably in the range of 0.1~0.5 mm. A diameter of wire which is too large is not desirable. Also, a too small diameter of wire will naturally have an undesirably small mechanical strength, making it difficult to fixedly arrange the net to serve as an electrode. Also, the distance between any adjacent opposing extensions of wire constituting the meshes may be about 0.2~5 mm, preferably about 0.5~2 mm by taking the size of flakes into consideration. It should be noted also that the net-like electrode 12 is detachably provided, and that, by preparing a plurality of net-like electrodes of several different sizes so as to be replaced to comply with the diameter of the drum 11, it becomes possible to hold the distance between the opposing electrodes constant always, and thus it is possible to keep the glow discharge condition constant.

The reason why the net-like electrode 12 surrounds the tubular electrode 11 in the embodiment of FIG. 3 is that, because this latter electrode 11 is cylindrical, the electrode 12 surrounds the drum 11 in order to produce a uniform film thereon. In the event that the drum electrode 11 is of any other configuration, the net-like electrode 12 may not have to surround the electrode 11.

Figure 4:
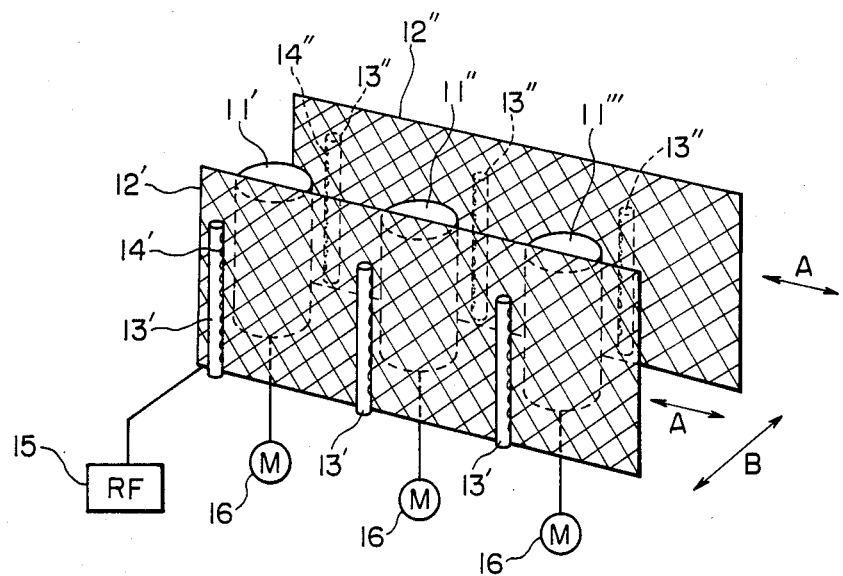
FIG. 4 is a diagrammatic illustration, showing a perspective view of an essential portion of another embodiment of the capacitance coupled type plasma CVD apparatus according to the present invention.

FIG. 4 shows another embodiment of the present invention. There is shown therein an example of net-like electrode structure for forming an a-Si film either simultaneously on each surface of a plurality of drums or on the surfaces of a plurality of rotatable drums successively while moving them one after another. In this embodiment, a pair of net-like flat electrodes 12' and 12" are disposed in parallel with each other, sandwiching a plurality of drums 11', 11", 11''', ... therebetween. These drums 11', 11", 11''' ... are rotated resepctively by their mating motors 16 at a desired speed. A plurality of pairs of gas introducing tubes 13' and 13" having their gas ejection orifices 14' and 14" are disposed so as to contact the net-like flat electrodes 12' and 12", or they are disposed on the outside thereof on that side away from the drums. An RF power supply 15 is connected, in common, to the opposing pairs of net-like flat electrodes 12' and 12" in this embodiment. Alternatively, the RF power supply may be connected separately to each one of the opposing flat electrodes 12' and 12". In such an instance, if arrangement is provided so that either the drum electrodes 11', 11", 11''', ... are to be moved successively and/or concurrently therewith the opposing net-like electrodes 12' and 12" also are to be moved in the direction of arrows A, it is possible to perform the formation of films on the surfaces of the drums successively. Furthermore, if arrangement is provided so that the opposing net-like electrodes 12' and 12" can be moved in the direction of arrows B also, it is possible to keep the distance across the opposing electrodes constant regardless of the diameter of the drums employed. This latter arrangement is convenient for holding the glow discharge condition always constant.

As discussed above, by using the net-like electrodes of the present invention, there can be avoided the production of undesirable deposits or following off of deposits, so that operation over an extended period of time becomes feasible. Furthermore, by constructing the apparatus in such a way as has been described in connection with FIG. 4, the formation of a film can be performed at a high speed. Therefore, such an apparatus can be suitably utilized as an apparatus for mass production. In case it is intended to provide a high-speed mass production apparatus, the opposing net-like flat electrodes may be disposed in a plurality of adjacent pairs, if required.

In the embodiments shown, detailed description has been made with respect to the formation of an a-Si film on the surface of a cylindrical substrate by relying on the plasma CVD technique using $SiH_4$ gas, and also with respect to some examples of apparatus structure to be used for practicing the abovesaid formation of film. It should be noted, however, that the present invention is not limited thereto, but the present invention can be applied to apparatuses for practicing plasma CVD technique of any other substances, and also to the products obtained therefrom.

What is claimed is:

1. A plasma CVD apparatus, comprising:
   a closed but evacuable reaction chamber;
   an electro-conductive smooth-surfaced substrate housed in said reaction chamber, said substrate serving as a counterelectrode;
   an electrode having a net-like structure made of an electroconductive metal wire and disposed to face said substtate within said reaction chamber;
   a RF power supply provided externally of said reaction chamber and connected across said substrate and said net-like electrode to develop a glow discharge thereacross;
   a gas ejection member having at least one gas ejection orifice and provided in said reaction chamber to introduce a reaction gas in a non-ionized state into said reaction chamber; and
   a reaction gas supply provided externally of said reaction chamber and coupled to said gas ejection member to supply thereto said non-ionized reaction gas under pressure,
   whereby, while introducing a pressurized non-ionized reaction gas into said reaction chamber, a glow discharge is developed across the substrate and said net-like electrode to decompose said non-ionized reaction gas to produce a reaction product to be deposited as a thin film on the surface of said substrate.

2. A plasma CVD apparatus according to claim 1, wherein said apparatus is of capacitance coupled type.

3. A plasma CVD apparatus according to claim 1, wherein said net-like electrode is made of stainless steel wire.

4. A plasma CVD apparatus according to claim 1, wherein said metal wire of said net-like electrode has a diameter ranging from 0.05 mm to 2 mm, and the net has meshes each being composed of opposing runs of said wire disposed at a distance ranging from 0.02 mm to 5 mm.

5. A plasma CVD apparatus according to claim 1, wherein said gas ejection orifice is provided in a plural number.

6. A plasma CVD apparatus according to claim 1, wherein said gas ejection orifice of said gas introducing member is positioned on a same plane as that of said net-like electrode behind this net on that side which does not face the substrate.

7. A plasma CVD apparatus according to claim 1, wherein said gas ejection orifice of said gas introducing member is positioned at a distance behind the electrode net on that side which does not face the substrate.

8. A plasma CVD apparatus according to claim 1, wherein said substrate is of a cylindrical configuration and said net-like electrode is of a cylindrical configuration concentrically surrounding said substrate.

9. A plasma CVD apparatus according to claim 1, wherein said net-like electrode is provided as a pair of opposing parallel flat sheets of net sandwiching therebetween said substrate having a rotable cylindrical structure which is rotated from an external driving means.

10. A plasma CVD apparatus according to claim 9, wherein said rotatable substrate is provided in a plural number and further having means for moving said substrates between said pair of parallel opposing net-like flat electrodes and for allowing said plural substrates to be taken out successively to the outside of the apparatus.

11. A plasma CVD apparatus according to claim 1, wherein the thin film deposited on said substrate is that of amorphous silicon.

12. A plasma CVD apparatus, comprising:
a closed but evacuable chamber;
an electro-conductive smooth-surfaced substrate housed in said reaction chamber, said substrate serving as a counterelectrode;
an electrode having a net-like structure made of an electroconductive metal wire and disposed to face said substrate within said reaction chamber;
an RF power supply provided externally of said reaction chamber and connected across said substrate and said net-like electrode to develop a glow discharge thereacross;
a gas ejection member having at least one gas ejection orifice and provided in said reaction chamber, in a position on the reverse side of said net-like electrode with respect to said substrate, to introduce a reaction gas into said reaction chamber; and
a reaction gas supply provided externally of said reaction chamber and coupled to said gas reaction member to supply thereto said reaction gas under pressure,
whereby, while introducing a pressurized reaction gas into said reaction chamber, a glow discharge is developed across the substrate and said net-like electrode to decompose said reaction gas to produce a reaction product to be deposited as a thin film on the surface of said substrate.

13. An apparatus for performing plasma chemical vapor deposition on an electro-conductive substrate, comprising:
an electrode having a net-like structure;
a counterelectrode composed of said substrate and disposed to face said net-like electrode;
an evacuable reaction chamber enclosing said net-like electrode and said substrate;
means for introducing a reaction gas into said reaction chamber; and
means for applying an RF electric potential across said net-like electrode and said substrate, thereby to cause a glow discharge to develop in a region between said net-like electrode and said substrate wherein said reaction gas decomposes to produce a reaction product to be deposited as a thin film on the surface of said substrate electrode.

14. An apparatus for performing plasma chemical deposition on electro-conductive substrates successively, comprising:
an electrode composed of a pair of opposing flat net-like surfaces;
a plurality of substrates serving as counterelectrodes disposed in between said parallel net-like electrode surfaces;
an evacuable reaction chamber enclosing said parallel net-like electrodes and said substrates;
means for translating said substrates in succession into said reaction chamber;
means for relative translation of said substrates longitudinally along and in between said parallel electrodes;
means for translating said substrates in succession out of said reaction chamber in succession;
means for introducing a reaction gas into said reaction chamber; and
means for applying an RF electric potential across said parallel electrode and said substrates, thereby to cause a glow discharge to develop in a region between said parallel electrodes and said substrates wherein said reaction gas decomposes to produce a reaction product to be deposited as a thin film on the surfaces of said substrates as they pass between said parallel electrodes in succesion.

15. A plasma CVD apparatus, comprising:
a closed but evacuable reaction chamber;
an electro-conductive smooth-surfaced substrate housed in said reaction chamber, said substrate serving as a counterelectrode;
an electrode having a net-like structure made of an electroconductive metal wire and disposed to face said substrate within said reaction chamber, said net-like electrode is provided as a pair of opposing parallel flat sheets of net sandwiching therebetween said substrate;
means for moving said pair of opposing parallel net-like electrodes toward and away from each other to adjust their mutual distance relative to said substrates;
a power supply provided externally of said reaction chamber and connected across said substrate and said net-like electrode to develop a glow discharge thereacross;
a gas ejection member having at least one gas ejection orifice and provided in said reaction chamber to introduce a reaction gas into said reaction chamber; and a raaction gas supply provided externally of said reaction chamber and coupled to said gas ejection member to supply thereto said reaction gas under pressure, whereby, while introducing a pressurized reaction gas into said reaction chamber, a glow discharge is developed across the substrate and said net-like electrode to decompose said reaction gas to produce a reaction product to be deposited as a thin film on the surface of said substrate.

16. A plasma CVD apparatus, comprising:

a closed but evacuable reaction chamber;

an electro-conductive smooth-surfaced substrate housed in said reaction chamber, said substrate serving as a counterelectrode;

an electrode having a net-like structure made of an electroconductive metal wire and disposed to face said substrate within said reaction chamber, said net-like electrode is provided as a pair of opposing parallel flat sheets of net sandwiching therebetween said substrate;

means for moving said pair of opposing parallel net-like electrodes in a same direction while maintaining their mutual distance constant;

a power supply provided externally of said reaction chamber and connected across said substrate and said net-like electrode to develop a glow discharge thereacross;

a gas ejection member having at least one gas ejection orifice and provided in said reaction chamber to introduce a reaction gas into said reaction chamber; and a reaction gas supply provided externally of said reaction chamber and coupled to said gas ejection member to supply thereto said reaction gas under pressure, whereby, while introducing a pressurized reaction gas into said reaction chamber, a glow discharge is developed across the substrate and said net-like electrode to decompose said reaction gas to produce a reaction product to be deposited as a thin film on the surface of said substrate.

17. A plasma CVD apparatus according to claim 16 wherein said pair of opposing parallel net-like electrodes are also movable toward and away from each other to adjust their mutual distance relative to said substrates.

18. A plasma CVD apparatus according to any one of claims 15, 16 and 17 wherein said substrate is of a cylindrical structure which is rotatable by an external driving means.

19. A plasma CVD apparatus according to claim 18 wherein said rotatable substrate is provided in plural number and further having means for moving said substrates between said pair of parallel opposing net-like electrodes and means for allowing said parallel substrates to be granslated successively into and out of said reaction chamber.

* * * * *